(12) United States Patent
Kim et al.

(10) Patent No.: US 6,583,654 B2
(45) Date of Patent: Jun. 24, 2003

(54) CLOCK SYNCHRONIZATION DEVICE

(75) Inventors: Se Jun Kim, Kyoungki-do (KR); Jae Kyung Wee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/139,889

(22) Filed: May 6, 2002

(65) Prior Publication Data

US 2003/0001639 A1 Jan. 2, 2003

(30) Foreign Application Priority Data

Jun. 30, 2001 (KR) .......................................... 01-39037

(51) Int. Cl.[7] ................................................ H03L 7/00
(52) U.S. Cl. ......................... 327/160; 327/141; 341/54; 341/63
(58) Field of Search ................................ 327/141, 146, 327/155, 160; 341/54, 63, 64

(56) References Cited

U.S. PATENT DOCUMENTS 4,694,259 A   9/1987   Carickhoff et al. ......... 331/1 A
5,796,358 A * 8/1998   Shih et al. .................. 341/139

OTHER PUBLICATIONS

*Notice of Rejection* (with translation), corresponding to Korean Patent Application Serial No. 10–2001–0039037, Korean Intellectual Property Office, dated Jan. 23, 2003, 4 pages.

* cited by examiner

*Primary Examiner*—Timothy P. Callahan
*Assistant Examiner*—An T. Luu
(74) *Attorney, Agent, or Firm*—Marshall, Gerstein & Borun

(57) ABSTRACT

A clock synchronization device is disclosed that includes a phase detecting unit for detecting a phase difference between an external clock signal and an internal clock signal, a binary code generating unit for outputting a binary code value according to output signals from the phase detecting unit, a code converting unit for converting the binary code value from the binary code generating unit into a thermometer code value, a D/A converting unit for outputting a voltage corresponding to the thermometer code value from the code converting unit and a clock synchronization control unit for outputting the internal clock signal from the external clock signal according to the output voltage from the D/A converting unit. As the result, the clock synchronization device is controlled by employing the D/A converting unit for converting the binary code to the thermometer code in order to decrease the number of the registers, the leakage current and the chip size.

6 Claims, 4 Drawing Sheets

CLOCK SYNCHRONIZATION DEVICE

BACKGROUND

1. Field of the Invention

The present invention relates to a clock synchronization device and, in particular, to a clock synchronization device including a converting unit for converting a binary-weighted code to a thermometer code, thereby decreasing a number of registers and reducing a leakage current.

2. Description of the Background Art

In general, an analog clock synchronization device (delay locked loop (DLL) or phase locked loop (PLL)) has a smaller area, a wider operation region, higher accuracy and smaller jitter property than a digital clock synchronization device. However, the analog clock synchronization device consumes considerable DC current.

Accordingly, there has been suggested a method of combining the analog and digital devices by using a digital to analog converter (DAC or D/A converter). This method controls the clock synchronization device (DLL/PLL) by generating a digital code value corresponding to a phase difference between an external clock signal and an internal code value and then generating an analog value (voltage or current) according to the generated digital code value by using the DAC.

FIG. 1 is a block diagram illustrating a conventional clock synchronization device using a thermometer code DAC. The illustrated conventional clock synchronization device includes a phase detecting unit 1 for detecting a phase difference between an internal clock signal ICLK and an external clock signal ECLK. A register unit 2, outputs a thermometer code TC according to detection signals SFTR and SFTL received from the phase detecting unit 1. Also included is a D/A converting unit 3 for generating an output voltage VOUT corresponding to the thermometer code TC. Finally, a clock synchronization control unit 4 generates the internal clock signal ICLK from the external clock signal ECLK according to the output voltage VOUT from the D/A converting unit 3. The clock synchronization control unit 4 comprises a voltage controlled delay line when it is used in the DLL, but comprises a voltage controlled oscillator when it is used in the PLL.

If the number of bits of the D/A converting unit 3 is increased, the number of shift registers of the register unit 2 is increased by a multiplier of 2, thereby resulting in a large chip area and high leakage current. For example, when the D/A converting unit 3 includes 6 bits, the register unit 2 requires 64 shift registers.

To solve the foregoing problems, a binary-weighted DAC may be employed instead of the thermometer code DAC. However, linearity and monotony may be deteriorated due to a glitch in such systems.

SUMMARY OF THE INVENTION

The present disclosure provides a clock synchronization device including a converting unit for converting a binary-weighted code to a thermometer code, thereby decreasing a number of registers and finally reducing a leakage current.

According to the present disclosure, a clock synchronization device is provided that includes a phase detecting unit configured to detect a phase difference between an external clock signal and an internal clock signal. The device also includes a binary code generating unit configured to output a binary code value according to output signals received from the phase detecting unit. A code converting unit converts the binary code value received from the binary code generating unit into a thermometer code value. A digital-to-analog converting unit is included and configured to output an output voltage corresponding to the thermometer code value. Finally, a clock synchronization control unit is provided and configured to output the internal clock signal based on the external clock signal and the output voltage from the digital-to-analog converting unit.

DETAILED DESCRIPTION OF THE PREFERRED EMBODIMENTS

Figure 1:
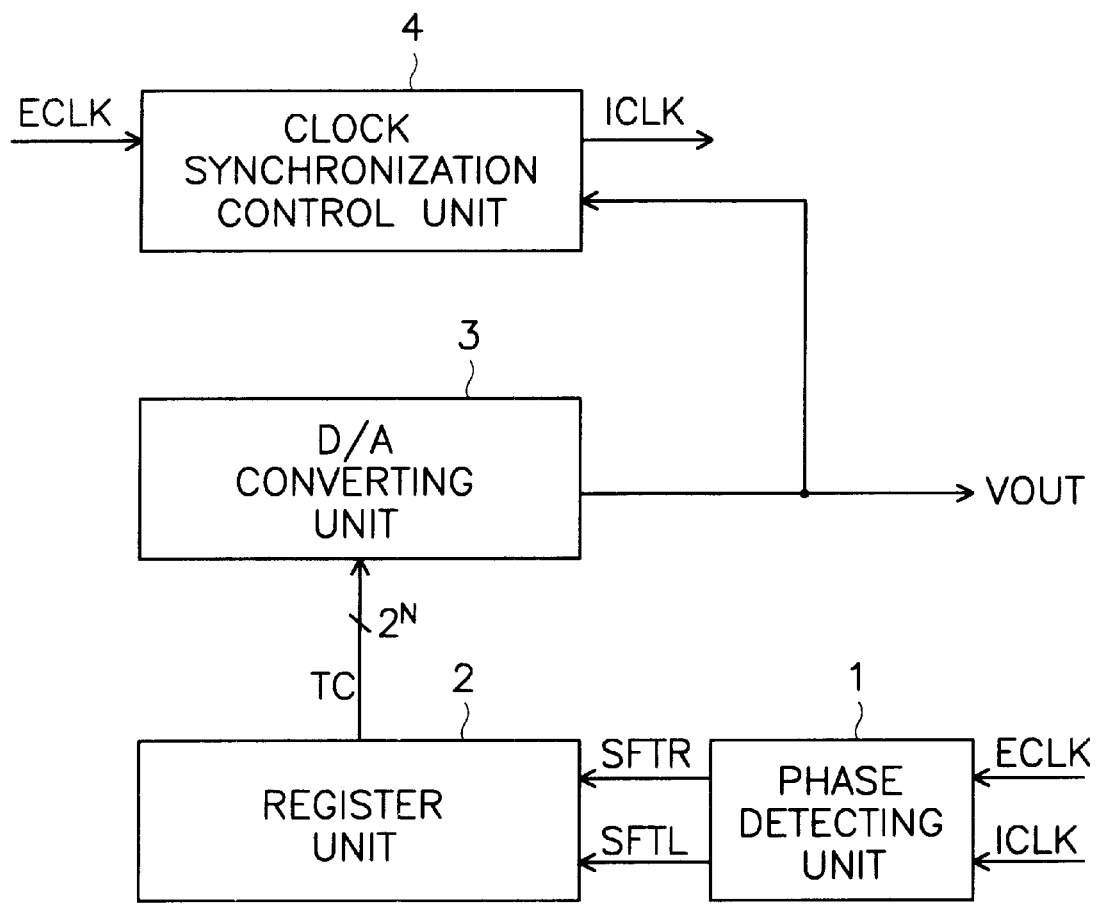
FIG. 1 is a block diagram illustrating a conventional clock synchronization device.
Figure 2:
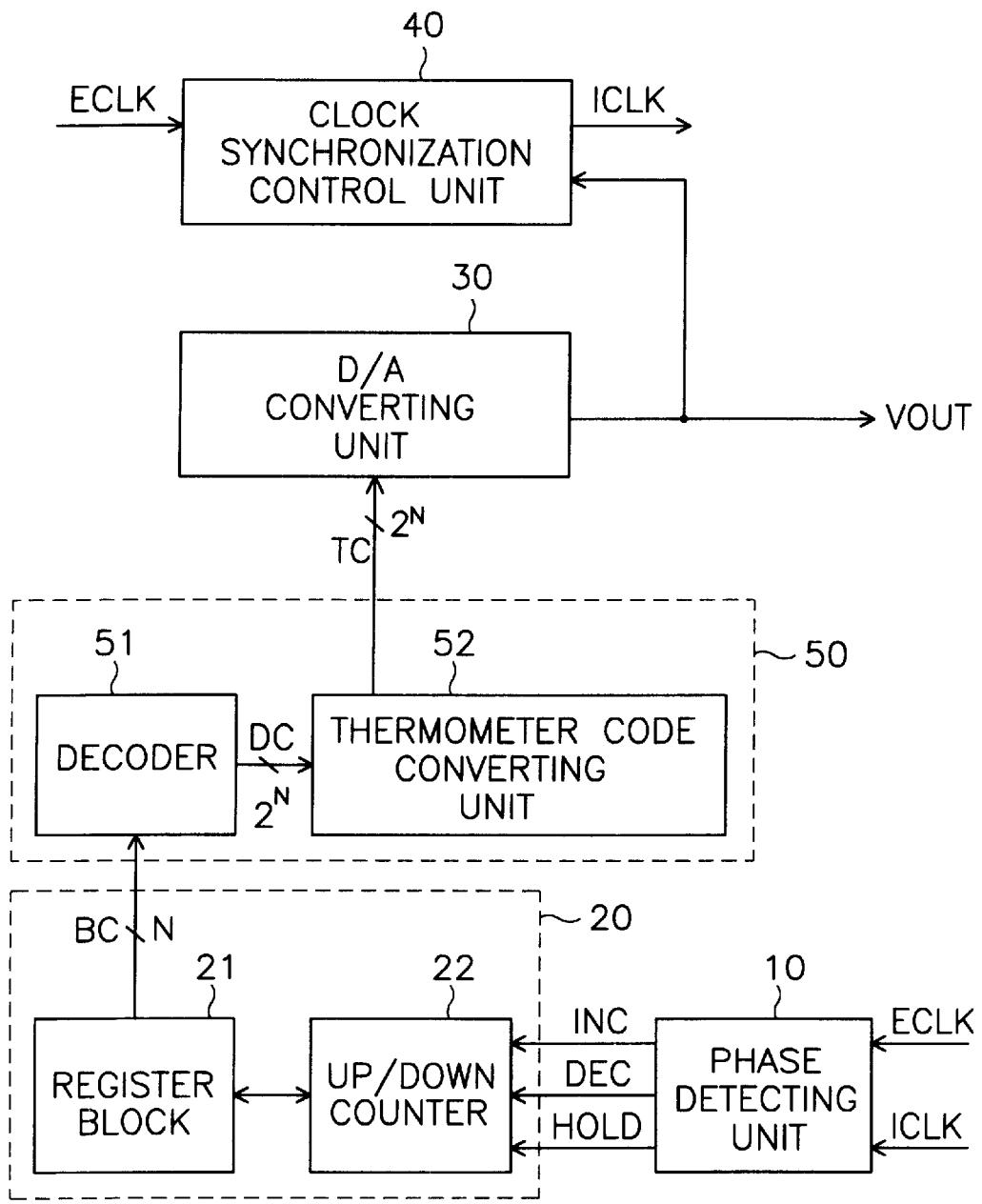
FIG. 2 is a block diagram illustrating a clock synchronization device that is presently disclosed.

FIG. 2 is a block diagram illustrating a presently disclosed clock synchronization device. This clock synchronization device includes a phase detecting unit 10 for detecting a phase difference between an external clock signal ECLK and an internal clock signal ICLK. A binary code generating unit 20 outputs a binary code value BC according to output signals INC, DEC and HOLD generated by and received from the phase detecting unit 10. In turn, a code converts unit 50 converts the binary code value BC into a thermometer code value TC. A D/A converting unit 30 outputs an output voltage VOUT corresponding to the thermometer code value TC received from the code converting unit 50. Finally, a clock synchronization control unit 40 generates the internal clock signal ICLK from the external clock signal ECLK according to the output voltage VOUT from the D/A converting unit 30. The clock synchronization control unit 40 comprises a voltage controlled delay line when it is used in the DLL and comprises a voltage controlled oscillator when it is used in the PLL.

When the phase of the internal clock signal ICLK is faster than the phase of the external clock signal ECLK, the phase detecting unit 10 outputs an increase command INC. When the phase of the internal clock signal ICLK is later than the phase of the external clock signal ECLK, the phase detecting unit 10 outputs a decrease command DEC. In addition, when the phase of the internal clock signal ICLK is identical to the phase of the external clock signal ECLK, the phase detecting unit 10 outputs a hold command HOLD.

The binary code generating unit 20 further includes a register block 21 comprised of a number of registers corresponding to a bit number used by the D/A converting unit 30. An up/down counter 22 is included for increasing, decreasing or holding the values stored in the registers of the register block 21 according to the output signals INC, DEC and HOLD received from the phase detecting unit 10.

When the phase detecting unit 10 outputs the increase command INC, the up/down counter 22 of the binary code generating unit 20 is operated as an up counter for increasing the binary code value currently stored in the registers of the register block 21 by one bit. In the case where the phase detecting unit 10 outputs the decrease command DEC, the up/down counter 22 is operated as a down counter for decreasing the binary code value currently stored in the registers of the register block 21 by one bit. Finally, when the phase detecting unit 10 outputs the hold command HOLD, the binary code value currently stored in the registers of the register block 21 is maintained without operating the up/down counter 22.

The binary code value BC outputted from the binary code generating unit 20 is converted into a thermometer code value TC by the code converting unit 50.

Figure 3:
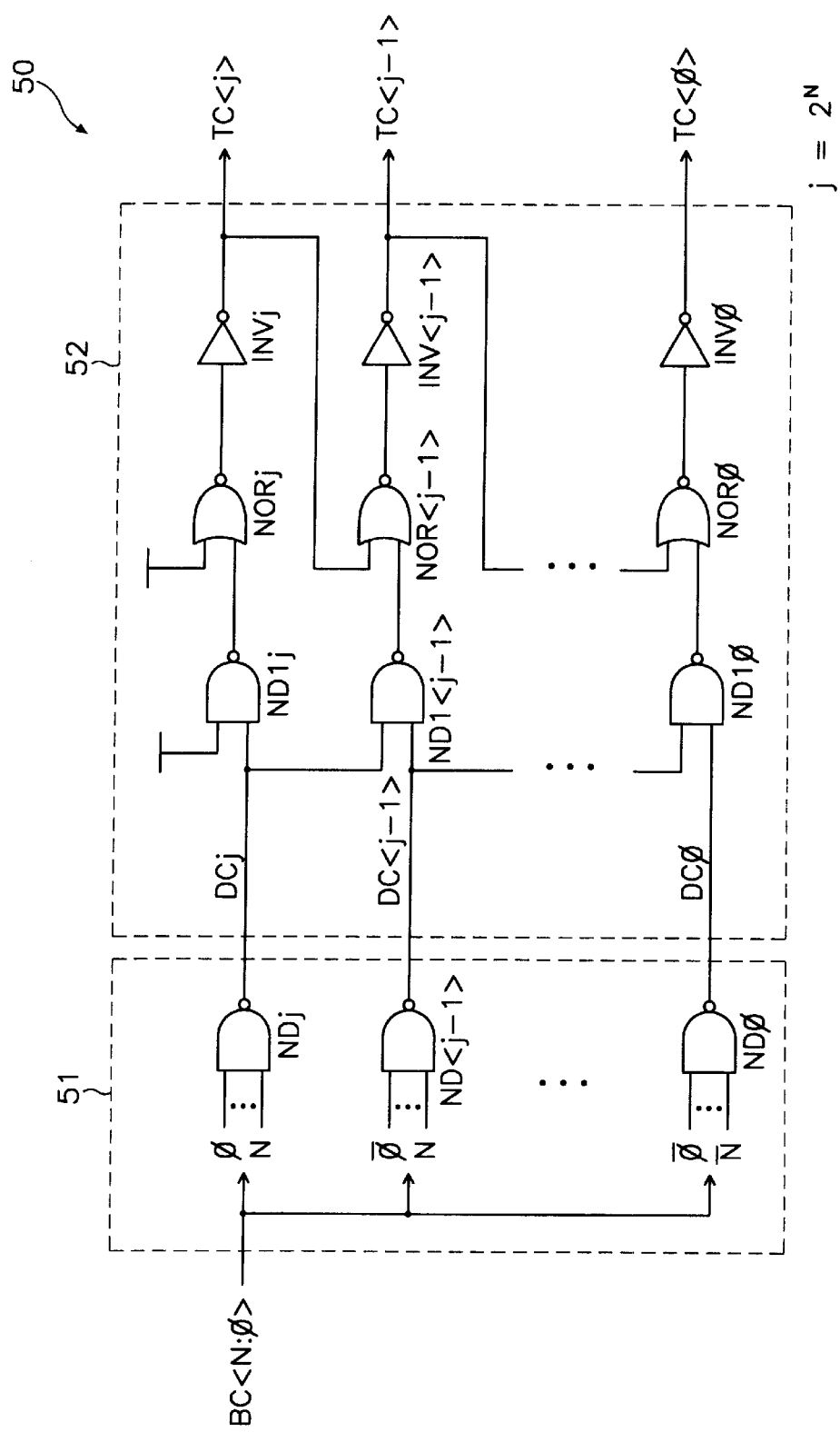
FIG. 3 is a detailed circuit diagram illustrating a code converting unit shown in FIG. 2.

FIG. 3 is a detailed circuit diagram illustrating the code converting unit 50 of FIG. 2. As depicted in FIG. 3, the code converting unit 50 includes a decoder 51 that decodes an N-bit binary code value BC<N:Ø> from the binary code generating unit 20 and outputs $2^N$ values DC<j:Ø>. The code converting unit 50 also includes a thermometer code converting unit 52 that converts the N-bit code value output from the decoder 51 into a thermometer code value TC<j:Ø>. Here, j is equal to $2^N$ and the decoder 51 comprises $2^N$ NAND gates ND0–NDj for decoding the N-bit input value.

The thermometer code converting unit 52 includes NAND gates ND10–ND1$j$ for NANDing the output values DC0–DCj from the NAND gates ND0–NDj of the decoder 51 with previous output values DC1–DCj. NOR gates NOR0–NORj NOR the output values from the NAND gates ND10–ND1$j$ with previous thermometer code values TC1–TCj. Finally, inverters INV0–INVj invert the output values from the NOR gates NOR0–NORj and output the thermometer code values TC<j:0>. Here, 'j=$2^N$' is satisfied.

Figure 4:
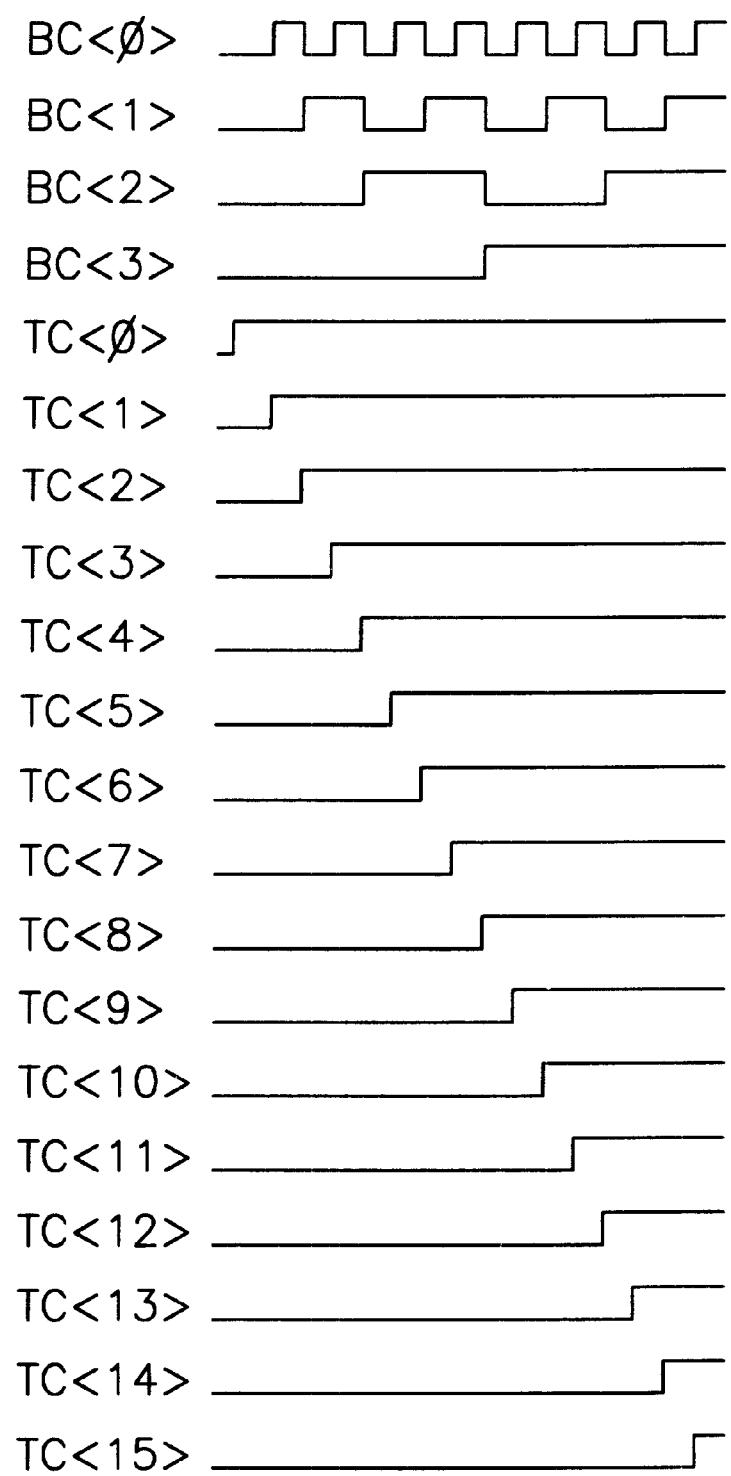
FIG. 4 is a simulation timing diagram of the clock synchronization device shown in FIG. 2.

FIG. 4 is a simulation timing diagram of the clock synchronization device of FIGS. 2 and 3. Here, the binary code is 4 bits and 'j=$2^N$' is satisfied.

When the output values from the binary code generating unit 20 are '0011', the decoder 51 of the code converting unit 50 decodes the binary code values, and outputs a decoding value of '1111111111110111'.

The output values from the decoder 51 of the code converting unit 50 are inputted to one of the respective input terminals of the NAND gates ND10–ND1$j$ of the thermometer code converting unit 52. Upper bit decoding values are inputted to the other input terminals thereof as illustrated in FIG. 3. Accordingly, the output values of the NAND gates ND10–ND1$j$ of the thermometer code converting unit 52 are '0000000000001100'.

Thereafter, the output values from the NAND gates ND10–ND1$j$ of the thermometer code converting unit 52 are inputted to one of the respective terminals of the NOR gates NOR0–NORj, and upper bit thermometer code output values are inputted to the other input terminals thereof as illustrated in FIG. 3. The inverters INV0–INVj invert the output values from the NOR gates NOR0–NORj, and output a thermometer code value TC of '0000000000001111'.

As compared with a general code conversion method, the code conversion of the presently disclosed device is performed in a short time.

The thermometer code value TC of the code converting unit 50 is inputted to the D/A converting unit 30, and the D/A converting unit 30 generates a voltage corresponding to the thermometer code value TC.

As discussed earlier, the disclosed clock synchronization device is controlled by employing the converting unit for converting the binary code to the thermometer code in order to decrease the number of the registers, the leakage current and the chip size.

While the teachings of the invention have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A clock synchronization device comprising:

a phase detecting unit configured to detect a phase difference between an external clock signal and an internal clock signal;

a binary code generating unit configured to output a binary code value according to output signals received from the phase detecting unit;

a code converting unit configured to convert the binary code value received from the binary code generating unit into a thermometer code value;

a digital-to-analog converting unit configured to output an output voltage corresponding to the thermometer code value; and a clock synchronization control unit configured to output the internal clock signal based on the external clock signal and the output voltage from the digital-to-analog converting unit.

2. The clock synchronization device according to claim 1, wherein the binary code generating unit further comprises:

a register block comprised of a same number of registers as a bit number used in the D/A converting unit; and an up/down counter configured to at least one of increase, decrease and hold values stored in the registers of the register block according to the output signals received from the phase detecting unit.

3. The clock synchronization device according to claim 2, wherein the phase detection unit is configured to:

operate the up/down counter as an up counter to increase the binary code value currently stored in the registers of the register block by one bit when a phase of the internal clock signal is faster than a phase of the external clock signal;

operate the up/down counter as a down counter to decrease the binary code value currently stored in the registers of the register block by one bit when the phase of the internal clock signal is later than the phase of the external clock signal; and maintain the binary code value currently stored in the registers of the register block is by not operating the up/down counter when the phase of the internal clock signal is identical to the phase of the external clock signal.

4. The clock synchronization device according to claim 1, wherein the code converting unit further comprises:

a decoder for decoding an N-bit binary code value from the binary code generating unit and outputting $2^N$ values; and a thermometer code converting unit for converting the $2^N$ values output from the decoder into a thermometer code value.

5. The clock synchronization device according to claim 4, wherein the thermometer code converting unit further comprises:

a plurality of NAND gates to which respective ones of the 2N values output from the decoder are respectively input at an input terminal of each corresponding NAND gate and upper output values by one bit as compared to the corresponding output values from the decoder are input to the respective other input terminals of the corresponding NAND gates, thereby performing an NAND operation;

a plurality of NOR gates to which the respective output values from the NAND gates are respectively input at an input terminal of each corresponding NOR gate and upper thermometer code values by one bit as compared to the corresponding thermometer code value are input to the respective other input terminals of the NOR gates, thereby performing a NOR operation; and a plurality of inverters each configured to invert an output value received from a corresponding NOR gate of the plurality of NOR gates and output the thermometer code value.

6. The clock synchronization device according to claim 1, wherein the clock synchronization control unit comprises a voltage controlled delay line when used in a delay locked loop and comprises a voltage controlled oscillator when used in a phase locked loop.

* * * * *

UNITED STATES PATENT AND TRADEMARK OFFICE
CERTIFICATE OF CORRECTION

PATENT NO. : 6,583,654 B2  Page 1 of 1
DATED : June 24, 2003
INVENTOR(S) : Se Jun Kim et al.

It is certified that error appears in the above-identified patent and that said Letters Patent is hereby corrected as shown below:

Column 4,
Line 66, please delete "2N values" and insert -- $2^N$ values --.

Signed and Sealed this

Thirtieth Day of September, 2003

JAMES E. ROGAN
*Director of the United States Patent and Trademark Office*